(12) United States Patent
Liao

(10) Patent No.: US 6,669,313 B2
(45) Date of Patent: Dec. 30, 2003

(54) FASTENING DEVICE FOR ELECTRONIC BOARD

(75) Inventor: Hung-Ta Liao, Taipei (TW)

(73) Assignee: Quanta Computer Inc. (TW)

( * ) Notice: Subject to any disclaimer, the term of this patent is extended or adjusted under 35 U.S.C. 154(b) by 65 days.

(21) Appl. No.: 10/056,525

(22) Filed: Jan. 23, 2002

(65) Prior Publication Data

US 2003/0137226 A1 Jul. 24, 2003

(51) Int. Cl.[7] ................................................ A47B 5/00
(52) U.S. Cl. ............................................ 312/7.2; 361/796
(58) Field of Search ............................ 312/7.2, 223.1, 312/223.2; 248/220.21, 220.31; 411/508, 509, 510; 361/683, 796, 799, 800, 807, 816; 211/41.17

(56) References Cited

U.S. PATENT DOCUMENTS

| 5,191,513 A | * | 3/1993 | Sugiura et al. ............. 361/399 |
| 5,575,545 A | * | 11/1996 | Wang ........................ 312/7.2 |
| 5,978,232 A | * | 11/1999 | Jo ............................. 361/796 |
| 6,424,538 B1 | * | 7/2002 | Paquin ...................... 361/752 |

FOREIGN PATENT DOCUMENTS

| CA | 851612 | * | 9/1970 | ............... 312/7.2 |

* cited by examiner

*Primary Examiner*—James O. Hansen
(74) *Attorney, Agent, or Firm*—Perkins Coie LLP; Paul L. Hickman; David B. Dort

(57) ABSTRACT

A fastening device for an electronic board comprises a base unit, a position shaft and a resilience device wherein the base unit has a first opening, a second opening and a sidewall used to connect the first opening and the second opening. The surface region of base unit adjacent to the first opening has a plurality of protrusions and the sidewall essentially includes a plurality of extension portions for tightly withstanding the electronic board by resilience inducing from the extension portion. The position shaft has a first flange having a smaller size than that of first opening to pass through the first opening and a second flange having a larger size than that of first opening to lean against the inner surface region of first opening. The resilient device, coupled to the position shaft and inside the sidewall, automatically aligns the locating holes of the electronic board.

18 Claims, 5 Drawing Sheets

FASTENING DEVICE FOR ELECTRONIC BOARD

FIELD OF THE INVENTION

The present invention generally relates to a fastening device, and more particularly, to a fastening device for an electronic board.

BACKGROUND OF THE INVENTION

With the rapid development of information technology, a lot of computer products and their peripheral equipment, e.g. motherboard being a kernel of the computer, have been becoming more and more widespread. Besides the operation of central processing unit (CPU) on the motherboard, the computer having many peripheral devices, such as hard disk drive (HDD), floppy disk drive (FDD) and digital versatile device (DVD) etc, must induce vibration effect to a computer case containing theses peripheral devices. Therefore, how to fasten motherboard to a frame case within the computer case for performing computer operation is an important issue. In addition, how to provide an easier and quicker way for loading and unloading the motherboard is also an important topic of manufactures.

Referring to FIG. 1, this figure shows a motherboard 100 is fixed to a frame case 106 by screws 102 according to the prior art. These screws 102 used as fastening components secure conventional motherboard 100 on the frame case 106. Showed in the local view 103 with respect to the frame case 106, a plurality of copper pillars 104 with inner screw are sequentially fixed on the frame case 106 before a plurality of locating holes on the motherboard 100 are aligned to theses copper pillars 104. Next, a plurality of screws 102 is driven into these coppers by using screwdriver. In conventional, auxiliary tool kits, e.g. various screwdrivers, are needed so that the complicated loading and unloading steps will decrease the throughput and the motherboard 100 maintenance efficiency. Even though a flexible piece is used to fasten the motherboard 100 to the frame case 106 before the frame case 106 is put into a computer case, it can not still acquire a better and quicker result with respect to the motherboard 100 installment. Consequently, there is a need for replacing screws 102 used in the conventional motherboard 100.

SUMMARY OF THE INVENTION

The primary object of the present invention is to utilize a fastening device for rapidly securing an electronic board to a frame case such that the use of auxiliary tools in the process of loading and unloading the electronic board is not entirely needed.

Another object of the present invention is to utilize a fastening device for replacing the screws and to reduce a great deal of screws so that the throughput and maintenance efficiency of a computer system are largely increased.

According to the above objects, the present invention sets forth a fastening device for the electronic board by alignment between fastening devices in the frame case and locating holes of the electronic board and then at least a manual bolt is may be selectively incorporated with the frame case. The fastening device essentially comprises a base unit, a position shaft and a resilient device.

The base unit, preferably annular polygon shape coupled to the frame case, has a first opening on the upper region of the base unit, a second opening on the lower region of the base unit and a sidewall used to connect both the first opening and the second opening. The surface region of base unit adjacent to the first opening has at least a protrusion for closely attaching the electronic board into the base unit. The sidewall further comprises at least an extension portion, preferably two symmetrical arc-shaped portions or the like, in the surface region adjacent to the first opening for tightly withstanding the electronic board by resilience inducing from the extension portion. One end portion of the extension portion is disposed in the sidewall and the other end portion freely is higher than the upper region of the base unit to block the electronic board.

The position shaft, similar to a column coupled to the base unit, has a first flange and a second flange. The first flange in one end of the position shaft has a smaller size than that of first opening to pass through the first opening and to be exposed outside the base unit. The second flange in the annular edge of the position shaft has a larger size than that of first opening to lean against the inner surface region of first opening. Furthermore, an interval space between first flange and second flange is used to clip the electronic board.

The resilient device, preferably a coil spring coupled to the position shaft, is disposed inside the sidewall for automatically aligning the locating holes of the electronic board and for readily loading and unloading the electronic board. Specifically, the position shaft is able to move back and forth inside the resilient device.

In summary, the loading and unloading steps of the fastening device in the present invention are not need any auxiliary tools are not needed for these electronic boards so that the assembly efficiency is considerably raised. Furthermore, since the position shaft freely moves a distance range back and forth inside the base unit, the electronic board is protected from harm when the electronic board contacts with the first flange. Moreover, interval space between said first flange and said second flange allows the fastening device to buckle any kind of locating holes of electronic boards, so the substitution of the electronic boards is increased to decrease the stock in the shop.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The present invention is directed to a fastening device for replacing screws to perform a rapid fastening process of electronic board such that the shortcomings of the prior art is improved.

Figure 1:
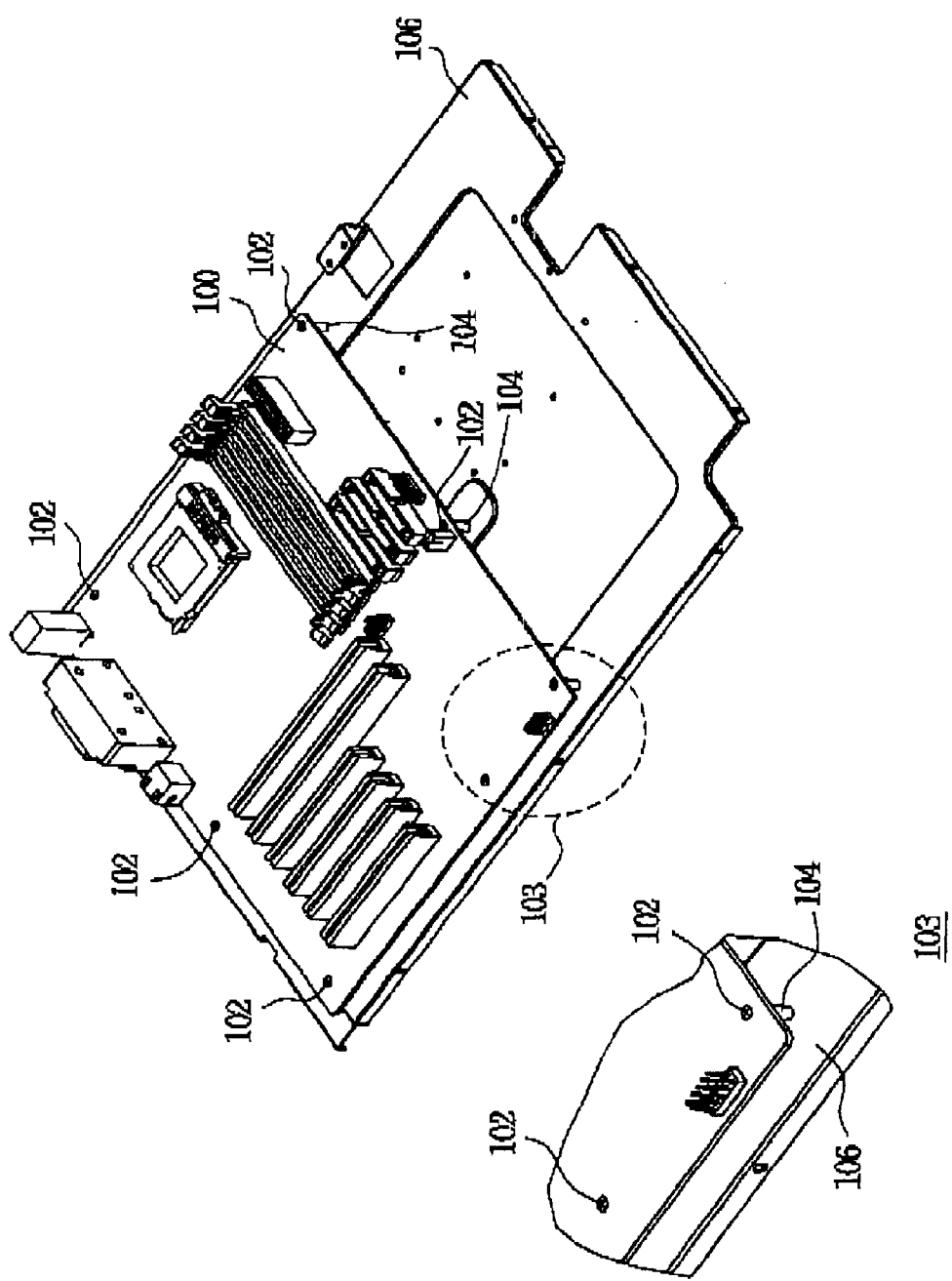
FIG. 1 illustrates a motherboard is fixed to the frame case by screws according to the prior art.
Figure 2B:
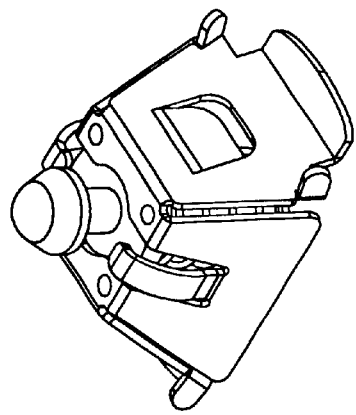
FIG. 2B illustrates an assembly view of a fastening device according to the present invention.
Figure 2A:
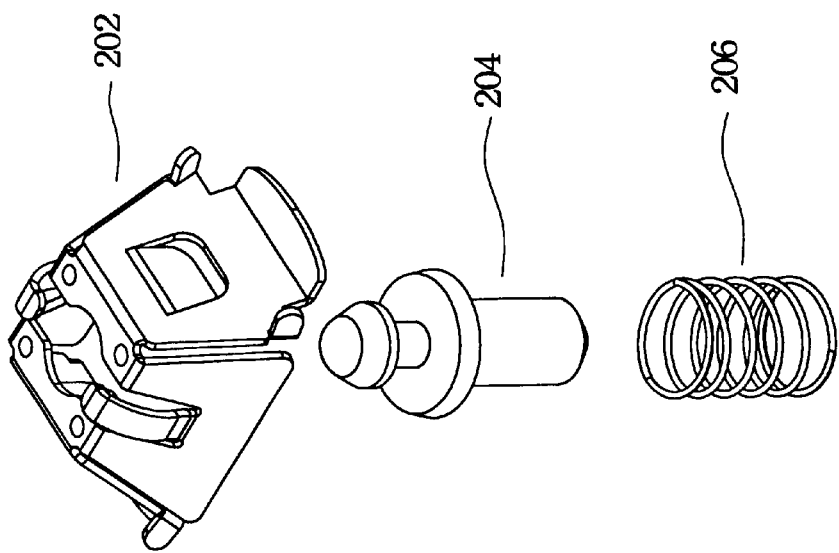
FIG. 2A illustrates a three-dimensional exploded view of a fastening device according to the present invention.

Referring to FIGS. 2A–2B, these figures show a three-dimensional exploded view and an assembly view of a fastening device according to the present invention respectively. The fastening device 200 used to load and unload the electronic board (not shown) comprises a base unit 202, a position shaft 204 and a resilient device 206. A plurality of fastening devices 200 are sequentially fixed on the frame case in practice. Afterwards, these fastening devices 200 are aligned with the locating holes on the electronic board before the position shafts 204 of fastening devices pass through the locating holes. Finally, the electronic board is slightly slid toward one side of the frame case to easily clip the electronic board by the position shafts 204. Alternatively, at least a manual bolt, preferably three manual bolts, is further disposed on some specific position of the frame case to complete the set-up process with respect to the electronic board. In the preferred embodiment of the present invention, the electronic board comprises any type of the computer motherboard, such as a personal computer or a server, or electronic devices.

Figure 2C:
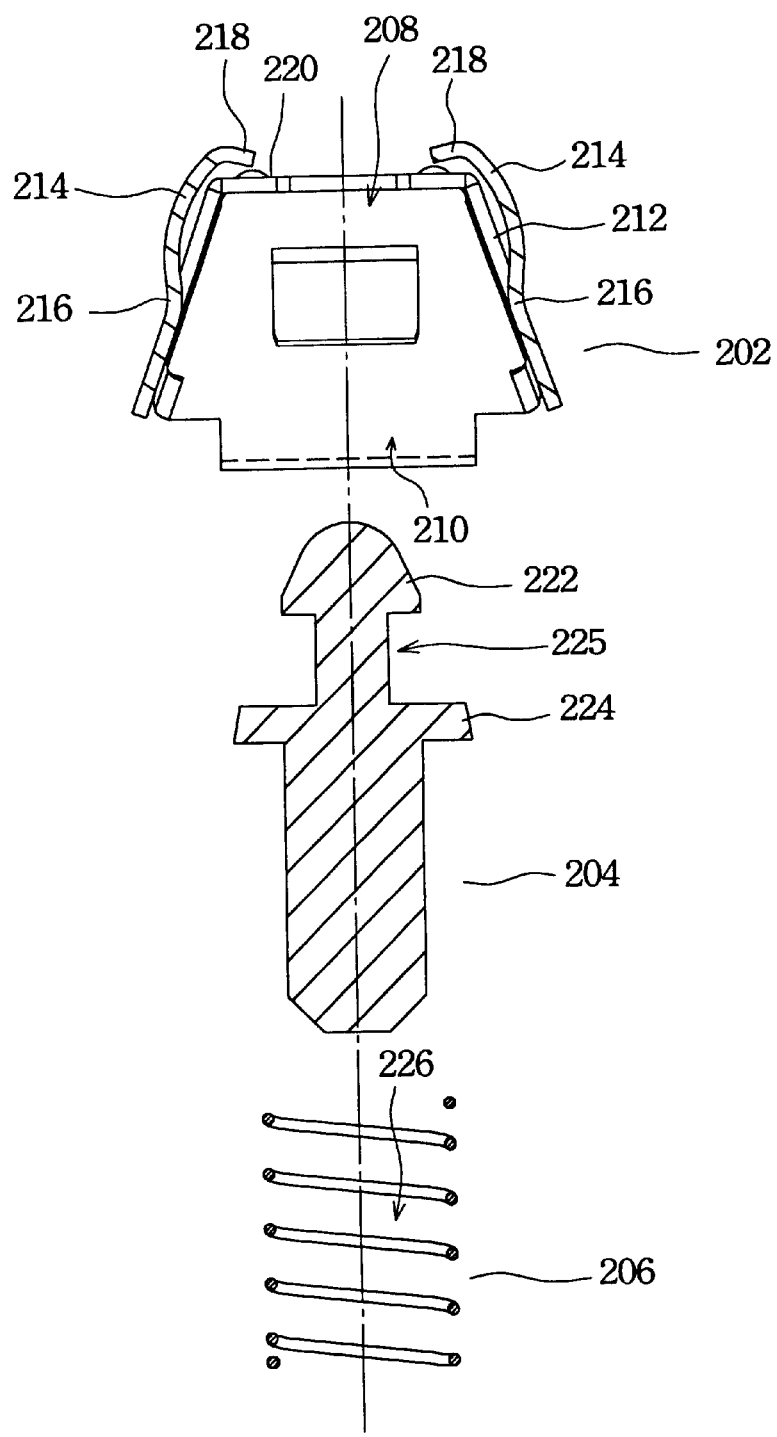
FIG. 2C illustrates a cross-sectional view of a fastening device according to the present invention.

Referring to FIG. 2C, this figure shows a cross-sectional view of a fastening device according to the present invention. The base unit 202, preferably polygonal shape coupled to the frame case, has a first opening 208 on the upper region 220 of the base unit 202, a second opening 210 on the lower region of the base unit 202 and a sidewall 212 used to connect to both the first opening 202 and the second opening 210. The sidewall 212 further comprises at least an extension portion 214, preferably two symmetrical arc-shaped or other geometry shape portions, disposed in the surface region adjacent to the first opening 202 for tightly withstanding the electronic board by resilience inducing from the extension portion 214. One end portion of the extension portion 214 is disposed in the sidewall 212 and the other end portion freely is higher than the upper region 220 of the base unit 202 to resist the electronic board.

The position shaft 204, similar to a column coupled to the base unit 202, has a first flange 222 and a second flange 224. The first flange 222 in one end of the position shaft 204 has a smaller size than that of first opening 202. The second flange 224 in the annular edge of the position shaft 204 has a larger size than that of first opening 202 to lean against the inner surface region of first opening 202. Furthermore, an interval space 225 between first flange 222 and second flange 224 is used to clip the electronic board. The first flange 222 shape is preferably any one type of a planar, square, domed shape and the like.

The resilient device 206, preferably a coil spring coupled to the position shaft 204, is disposed inside the sidewall 212 for automatically aligning the locating holes of the electronic board and for readily loading and unloading the electronic board. Specifically, the position shaft 204 is able to move back and forth inside the resilient device 206.

Figures 3A, 3B:
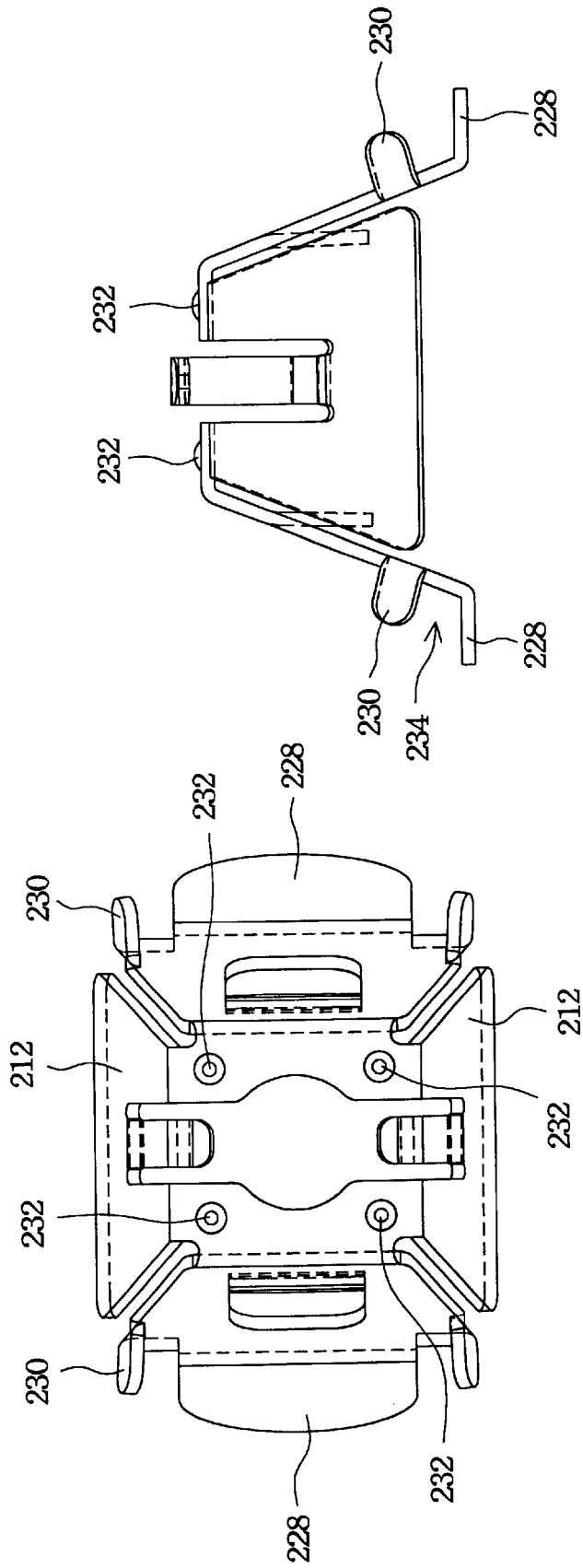
FIG. 3A illustrates a top view of the base unit of FIG. 2C according to the present invention.
FIG. 3B illustrates a side view of the base unit of FIG. 2C according to the present invention.

Referring to FIG. 3A, a top view of the base unit of FIG. 2C according to the present invention is shown. In the preferred embodiment of the present invention, the sidewall 212 of the base unit 202 essentially comprises a continuous wall or an intermittent wall, which is manufactured by a punching procedure. In addition, the surface region of base unit 202 adjacent to the first opening 208 further comprises at least a protrusion 232, preferably four protrusions, for closely attaching the electronic board into the base unit 202. Furthermore, while the protrusions 232 of the base unit 202 receives a downward force from the electronic board, theses protrusions are capable of generating a better electrical contact between the electronic board and the upper surface of the base unit 202.

Referring now to FIG. 3B, a side view of the base unit of FIG. 2C according to the present invention is shown. The sidewall 212 neae upper edge has a first flexure 228 and a second flexure 230, preferably a plurality of second flexures 230, such as at least two flexures, are respectively disposed in both side of the first flexure 228. The base unit 202 further comprises a spacing 234 between the first flexure 228 and the second flexure 230 near the second opening 210 for fastening the base unit 202 to the frame case. Alternatively, the first flexure 230 of the base unit 202 is inserted into slots (not shown) of the frame case. Furthermore, the extension portion 214 is the material of the metal for grounding to prevent electronic board from electromagnetic interference (EMI).

Figure 4:
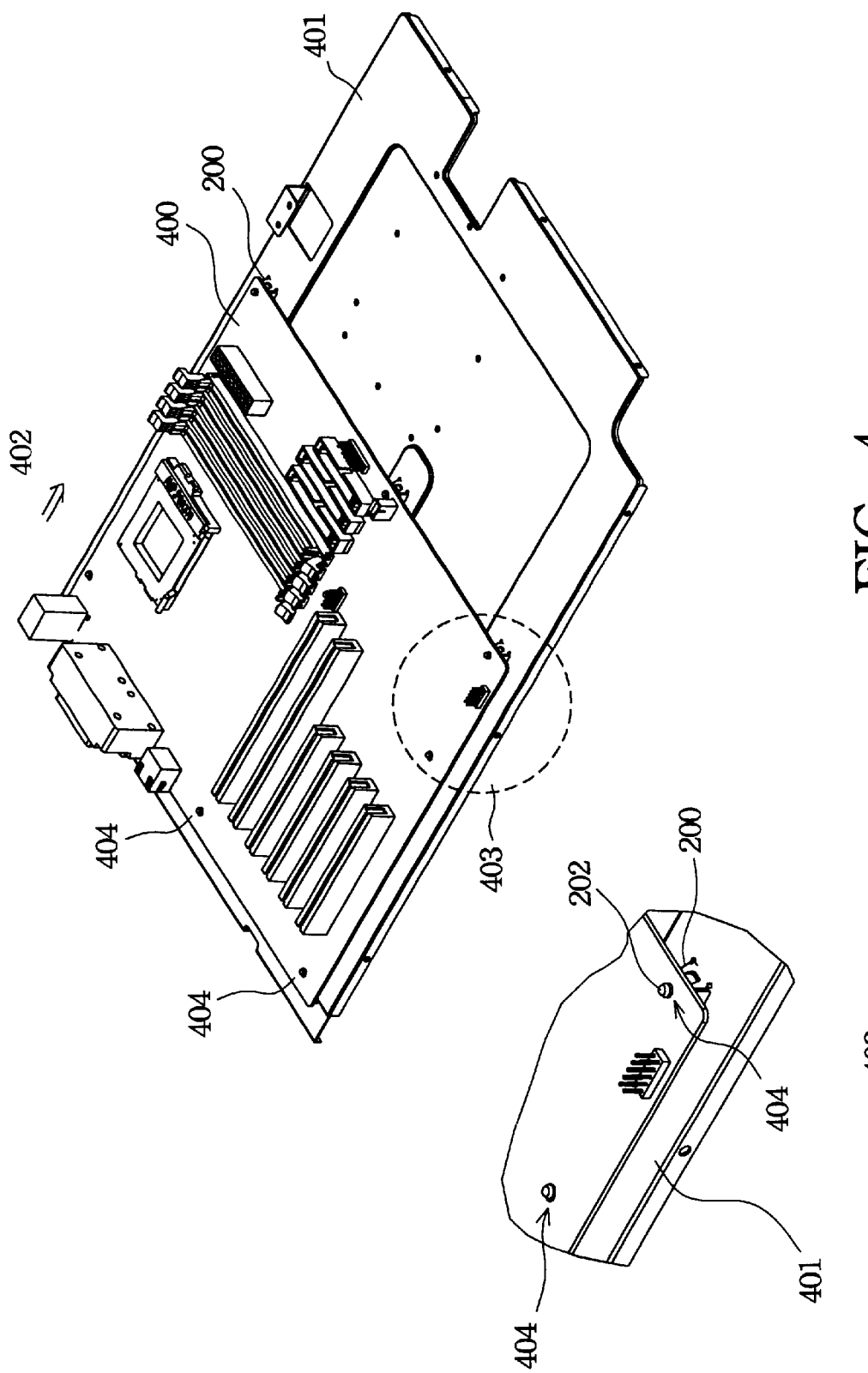
FIG. 4 illustrates one preferred embodiment of securing computer motherboard to the frame case by using a fastening device according to the present invention.

Referring to FIG. 4 and a local view 403, one preferred embodiment of securing computer motherboard to the frame case by using a fastening device according to the present invention is shown. During the loading steps of the computer motherboard, a plurality of fastening devices are sequentially fastened on the frame case in practice. Afterwards, these fastening devices are aligned with the locating holes on the motherboard before the position shafts of fastening devices pass through the locating holes. Finally, the motherboard is slightly slid toward one side of the frame case to easily buckle the electronic board by the position shafts. Further, at least a manual bolt, preferably three manual bolts, is also used to be disposed on some specific position of the frame case to complete the set-up process with respect to motherboard. In the opposite, The motherboard can be unloaded from the frame case in the reverse steps described in the above.

According to the aforementioned, the loading and unloading steps of the fastening device in the present invention are not need any auxiliary tools are not needed for these electronic boards so that the assembly efficiency is considerably raised. Furthermore, since the position shaft freely moves a distance range back and forth inside the base unit, the electronic board is protected from harm when the electronic board contacts with the first flange. Moreover, interval space between said first flange and said second flange allows the fastening device to buckle any kind of locating holes of electronic boards, so the substitution of the electronic boards is increased to decrease the stock in the shop.

As understood by a person skilled in the art, the foregoing preferred embodiments of the present invention are illustrations rather than limitations of the present invention. It is intended to cover various modifications and similar arrangements included within the spirit and scope of the appended claims, the scope of which should be accorded the broadest interpretation so as to encompass all such modifications and similar structure.

What is claimed is:

1. A fastening device for securing an electronic board, comprising:
    a frame case;
    a base unit with an annular polygon shape coupled to said frame case, having a first opening in an upper region of said base unit, a second opening in a lower region of said base unit and a sidewall used to connect said first opening with said second opening for withstanding said electronic board by resilience inducing from an extension portion having one end connected said sidewall and the other end being higher than said upper region of said base unit;
    a position shaft coupled to said base unit, having a first flange in one end of said position shaft, a second flange in an annular edge of said position shaft wherein the size of said first flange is less than that of said first opening and the size of said second flange is more than that of said first opening for leaning against an inner surface region of said first opening; and a resilient device coupled to said position shaft and inside said sidewall, for automatically aligning.

2. The fastening device of claim 1, further comprising a plurality of protrusions in the surface region adjacent to said first opening for closely attaching said electronic board into said base unit.

3. The fastening device of claim 1, wherein said sidewall is a continuous wall.

4. The fastening device of claim 1, wherein said sidewall is an intermittent wall.

5. The fastening device of claim 1, wherein said base unit near said second opening further comprises a bending portion for attaching said base unit into said electronic board.

6. The fastening device of claim 1, wherein said base unit further comprises a spacing between a first flexure and a second flexure near said second opening for buckling said base unit to said frame case.

7. The fastening device of claim 1, wherein a shape of said first flange is selected from the group consisting of a planar shape and domed shape.

8. The fastening device of claim 1, wherein an interval space between said first flange and said second flange is used to clip said electronic board.

9. A fastening device for securing an electronic board, comprising:

a frame case;

a base unit with an annular polygon shape coupled to said frame case, having a first opening in an upper region of said base unit, a second opening in a lower region of said base unit and a sidewall used to connect said first opening with said second opening for withstanding said electronic board by resilience inducing from an extension portion wherein a plurality of protrusions are located in a surface region of said base unit adjacent to said first opening;

a position shaft coupled to said base unit, having a first flange in one end of said position shaft, a second flange in an annular edge of said position shaft wherein the size of said first flange is less than that of said first opening and the size of said second flange is more than that of said first opening for leaning against an inner surface region of said first opening; and a resilient device, coupled to said position shaft and inside said sidewall, for automatically aligning.

10. The fastening device of claim 9, wherein said base unit near said second opening further comprises a bending portion for attaching said base unit into said electronic board.

11. The fastening device of claim 9, wherein said base unit further comprises a spacing between a first flexure and a second flexure near said second opening for buckling said base unit to said frame case.

12. The fastening device of claim 9, wherein one end portion is higher than said upper region, of said base unit with respect to said extension portion.

13. The fastening device method of claim 9, wherein a shape of said first flange is selected from the group consisting of a planar shape and domed shape.

14. The fastening device of claim 9, wherein an interval space between said first flange and said second flange is used to clip said electronic board.

15. A computer having a fastening device for securing an electronic board, comprising:

a frame case:

a base unit with an annular polygon shape coupled to said frame case, having a first opening in an upper region of said base unit a second opening in a lower region of said base unit and a sidewall used to connect said first opening with said second opening for withstanding said electronic board by resilience inducing from an extension portion having one end connected said sidewall and the other end being higher than said upper region of said base unit wherein a plurality of protrusions are located in a surface region of said base unit adjacent to said first opening;

a position shaft coupled to said base unit, having a first flange in one end of said position shaft, a second flange in an annular edge of said position shaft wherein the size of said first flange is less than that of said first opening and the size of said second flange is more than that of said first opening for leaning against an inner surface region of said first opening; and a resilient device, coupled to said position shaft and inside said sidewall, for automatically aligning.

16. The computer of claim 15, wherein said base unit near said second opening further comprises a bending portion for attaching said base unit into said electronic board.

17. The computer of claim 15, wherein said base unit further comprises a spacing between a first flexure and a second flexure near said second opening for buckling said base unit to said frame case.

18. The computer of claim 15, wherein a shape of said first flange is selected from the group consisting of a planar shape and domed shape.

* * * * *